(12) United States Patent
Kishi et al.

(10) Patent No.: US 9,041,036 B2
(45) Date of Patent: May 26, 2015

(54) SEMICONDUCTOR LIGHT EMITTING DEVICE WHEREIN A LINEAR EXPANSION COEFFICIENT OF AN INTERMEDIATE LAYER IS LARGER THAN A LINEAR EXPANSION COEFFICIENT OF A FIRST SEMICONDUCTOR LAYER AND SMALLER THAN A LINEAR EXPANSION COEFFICIENT OF A WAVELENGTH CONVERSION LAYER

(71) Applicant: Kabushiki Kaisha Toshiba, Minato-ku (JP)

(72) Inventors: Toshiyuki Kishi, Kanagawa-ken (JP); Hiroshi Koizumi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/023,595

(22) Filed: Sep. 11, 2013

(65) Prior Publication Data
US 2014/0252387 A1    Sep. 11, 2014

(30) Foreign Application Priority Data

Mar. 11, 2013 (JP) .................................. 2013-048299

(51) Int. Cl.
| H01L 33/00 | (2010.01) |
|---|---|
| H01L 33/44 | (2010.01) |
| H01L 33/50 | (2010.01) |
| H01L 33/62 | (2010.01) |

(52) U.S. Cl.
CPC ............. *H01L 33/44* (2013.01); *H01L 33/0079* (2013.01); *H01L 33/505* (2013.01); *H01L 33/507* (2013.01); *H01L 33/62* (2013.01); *H01L 2933/0041* (2013.01); *H01L 2224/13* (2013.01); *H01L 2924/0002* (2013.01)

(58) Field of Classification Search
CPC ......... H01L 33/02; H01L 33/24; H01L 33/50; H01L 33/501; H01L 33/502; H01L 33/503; H01L 33/44; H01L 33/507
See application file for complete search history.

(56) References Cited

U.S. PATENT DOCUMENTS

| 2004/0253427 | A1* | 12/2004 | Yokogawa et al. ........... 428/212 |
| 2012/0056222 | A1* | 3/2012 | Kitagawa et al. ............... 257/98 |
| 2013/0285064 | A1* | 10/2013 | Kojima et al. .................. 257/76 |

FOREIGN PATENT DOCUMENTS

| JP | 2010-135693 A | 6/2010 |
| JP | 4799606 | 8/2011 |
| JP | 2012-9469 A | 1/2012 |

* cited by examiner

*Primary Examiner* — Benjamin Sandvik
*Assistant Examiner* — Farid Khan
(74) *Attorney, Agent, or Firm* — Oblon, McClelland, Maier & Neustadt, L.L.P.

(57) ABSTRACT

According to one embodiment, a semiconductor light emitting device includes first and second columnar units, a wavelength conversion layer, a light emitting unit, a resin unit and an intermediate layer. The first columnar unit extends in a first direction. The second columnar unit is provided apart from the first columnar unit, and extends in the first direction. The wavelength conversion layer is provided apart from the first and second columnar units in the first direction. The light emitting unit includes first and second semiconductor layers, and a light emitting layer configured to emit a first light. The resin unit covers side surfaces along the first direction of the first and second columnar units and the light emitting unit, and a surface of the light emitting unit. The intermediate layer includes first and second portions, and has a thickness thinner than a peak wavelength of the first light.

19 Claims, 3 Drawing Sheets

SEMICONDUCTOR LIGHT EMITTING DEVICE WHEREIN A LINEAR EXPANSION COEFFICIENT OF AN INTERMEDIATE LAYER IS LARGER THAN A LINEAR EXPANSION COEFFICIENT OF A FIRST SEMICONDUCTOR LAYER AND SMALLER THAN A LINEAR EXPANSION COEFFICIENT OF A WAVELENGTH CONVERSION LAYER

CROSS-REFERENCE TO RELATED APPLICATIONS

This application is based upon and claims the benefit of priority from Japanese Patent Application No. 2013-048299, filed on Mar. 11, 2013; the entire contents of which are incorporated herein by reference.

FIELD

Embodiments described herein relate generally to a semiconductor light emitting device.

BACKGROUND

There is a semiconductor light emitting device that emits white light by combining a semiconductor light emitting element such as a blue LED (light emitting diode) and a resin including a fluorescent body, for example. High reliability is required for such a semiconductor light emitting device.

DETAILED DESCRIPTION

Figure 1A:
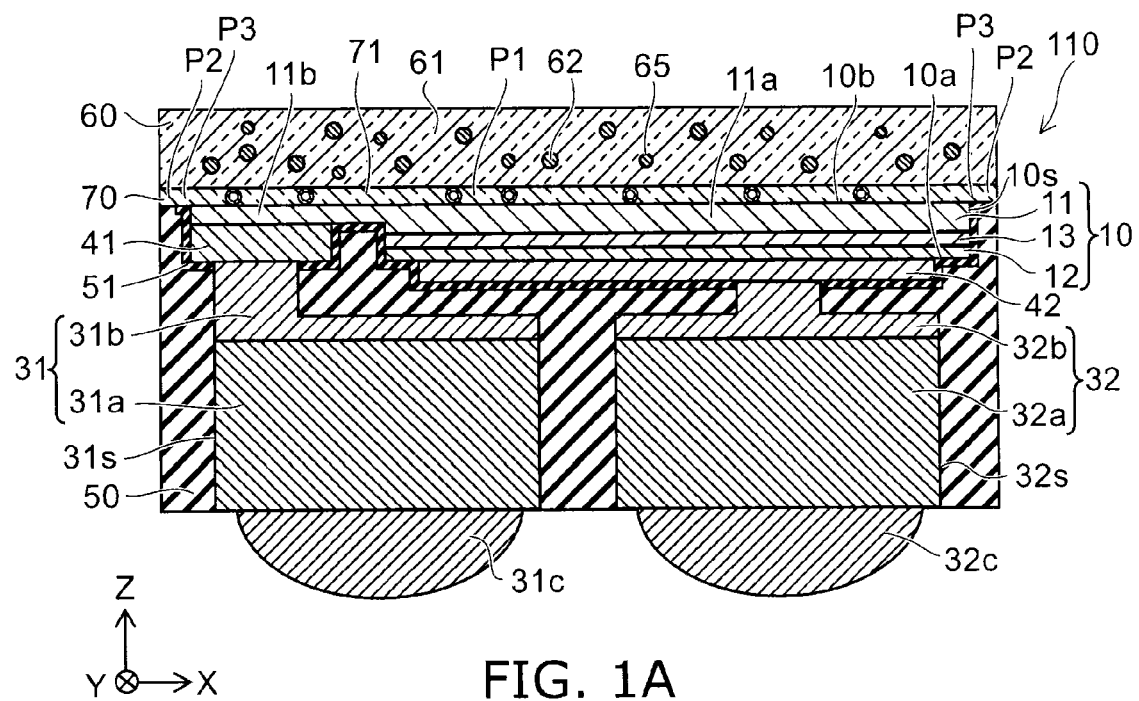
FIG. 1A and FIG. 1B are schematic views illustrating a semiconductor light emitting device according to a first embodiment.

According to one embodiment, a semiconductor light emitting device includes a first columnar unit, a second columnar unit, a wavelength conversion layer, a light emitting unit, a resin unit and an intermediate layer. The first columnar unit extends in a first direction and is conductive. The second columnar unit is provided apart from the first columnar unit in a second direction crossing the first direction, extends in the first direction and is conductive. The wavelength conversion layer is provided apart from the first columnar unit and the second columnar unit in the first direction. The light emitting unit includes a first semiconductor layer of a first conductivity type including a first semiconductor portion provided between at least part of the first columnar unit and the wavelength conversion layer and a second semiconductor portion provided between the second columnar unit and the wavelength conversion layer, a second semiconductor layer of a second conductivity type provided between the second columnar unit and the second semiconductor portion, and a light emitting layer provided between the second semiconductor portion and the second semiconductor layer and configured to emit a first light. The resin unit covers a side surface along the first direction of the first columnar unit, a side surface along the first direction of the second columnar unit, a side surface of the light emitting unit, and a surface on a side of the first columnar unit and the second columnar unit of the light emitting unit. The intermediate layer includes a first portion in contact with the first semiconductor layer and the wavelength conversion layer, and a second portion in contact with the resin unit and the wavelength conversion layer, and has a thickness thinner than a peak wavelength of the first light, and includes a material different from a material included in the wavelength conversion layer.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of the application and the drawings, components similar to those described in regard to a drawing thereinabove are marked with the same reference numerals, and a detailed description is omitted as appropriate.

First Embodiment

Figure 1B:
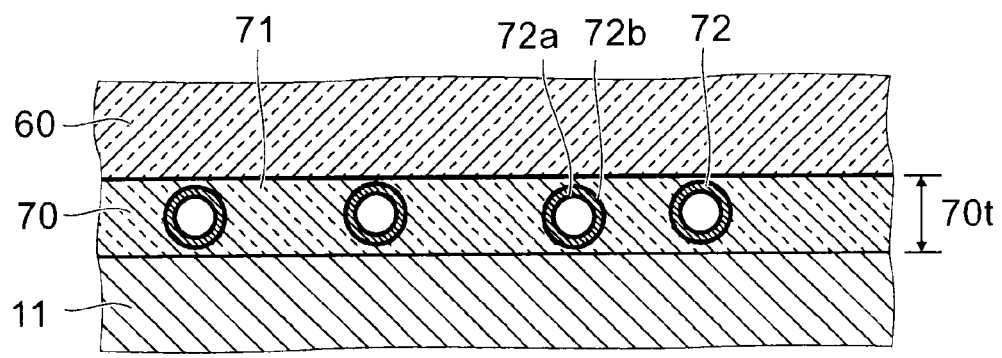

FIG. 1A and FIG. 1B are schematic views illustrating a semiconductor light emitting device according to a first embodiment.

That is, FIG. 1A is a schematic cross-sectional view. FIG. 1B is an enlarged schematic cross-sectional view showing part of the semiconductor light emitting device.

As shown in FIG. 1A, a semiconductor light emitting device 110 according to the embodiment includes a first columnar unit 31, a second columnar unit 32, a wavelength conversion layer 60, a light emitting unit 10, a resin unit 50, and an intermediate layer 70.

The first columnar unit 31 extends in a first direction, and is electrically conductive.

The first direction is taken as the Z-axis direction. One direction perpendicular to the first direction is taken as the X-axis direction. The direction perpendicular to the Z-axis direction and the X-axis direction is taken as the Y-axis direction.

The second columnar unit 32 is apart from the first columnar unit 31 in a second direction. The second columnar unit 32 extends in the Z-axis direction, and is electrically conductive. In this example, the second direction is the X-axis direction.

The wavelength conversion layer 60 is apart from the first columnar unit 31 and the second columnar unit 32 in the Z-axis direction. The thickness of the wavelength conversion layer 60 is not less than 80 μm and not more than 250 μm, for example.

The light emitting unit 10 includes a first semiconductor layer 11 of a first conductivity type, a second semiconductor layer 12 of a second conductivity type, and a light emitting layer 13.

The first conductivity type is the n type, and the second conductivity type is the p type, for example. In the embodiment, the first conductivity type may be the p type, and the second conductivity type may be the n type. In the following examples, it is assumed that the first conductivity type is the n type and the second conductivity type is the p type.

The first semiconductor layer 11 includes a first semiconductor portion 11a and a second semiconductor portion 11b. The first semiconductor portion 11a is provided between at least part of the first columnar unit 31 and the wavelength conversion layer 60. The second semiconductor portion 11b is provided between the second columnar unit 32 and the wavelength conversion layer 60.

The second semiconductor layer 12 is provided between the second columnar unit 32 and the second semiconductor portion 11b. The light emitting layer 13 is provided between the second semiconductor portion 11b and the second semiconductor layer 12.

The first semiconductor layer 11, the second semiconductor layer 12, and the light emitting layer 13 include a nitride semiconductor, for example. The light emitting unit 10 has a side surface 10s. The side surface 10s of the light emitting unit 10 is a surface crossing the X-Y plane (the plane perpendicular to the first direction). The light emitting unit 10 has a surface on the side of the first columnar unit 31 and the second columnar unit 32 (a first surface 10a) and a surface on the side of the wavelength conversion layer 60 (a second surface 10b).

The resin unit 50 covers a side surface 31s along the Z-axis direction of the first columnar unit 31, a side surface 32s along the Z-axis direction of the second columnar unit 32, and the side surface 10s of the light emitting unit 10. The resin unit 50 further covers a surface on the side of the first columnar unit 31 and the second columnar unit 32 of the light emitting unit 10 (the first surface 10a).

In this example, a first electrode 41 and a second electrode 42 are further provided. The first electrode 41 is in contact with the first semiconductor portion 11a between the first semiconductor portion 11a of the first semiconductor layer 11 and the first columnar unit 31. The second electrode 42 is in contact with the second semiconductor layer 12 between the second semiconductor layer 12 and the second columnar unit 32.

The resin unit 50 includes at least one of an epoxy resin and a polyimide resin, for example. Stability to heat, chemical stability, and high insulating properties are obtained.

In this example, the first columnar unit 31 includes a first metal column 31a and a first metal layer 31b. The first metal layer 31b is disposed between the first metal column 31a and the first electrode 41. The first metal layer 31b is in contact with the first electrode 41. The second columnar unit 32 includes a second metal column 32a and a second metal layer 32b. The second metal layer 32b is disposed between the second metal column 32a and the second electrode 42. The second metal layer 32b is in contact with the second electrode 42.

In this example, an insulating layer 51 is further provided. The insulating layer 51 is provided between the light emitting unit 10 and the resin unit 50. The insulating layer 51 covers a side surface (a surface non-parallel to the X-Y plane) of the light emitting unit 10, for example. The insulating layer 51 covers the first surface 10a of the light emitting unit 10, for example. That is, the resin unit 50 covers the first surface 10a of the light emitting unit 10 via the insulating layer 51. The insulating layer 51 is provided between part of the first metal layer 31b and part of the second electrode 42. Thereby, the size of the first columnar unit 31 when cut along the X-Y plane is made larger than the size of the first electrode 41. That is, the thickness of the first columnar unit 31 is thick. Thereby, high thermal conductivity via the first columnar unit 31 is obtained.

An oxide, a nitride, an oxynitride, or the like is used for the insulating layer 51, for example. At least one of silicon oxide, silicon nitride, and silicon oxynitride may be used for the insulating layer 51, for example.

In this example, a first connection member 31c and a second connection member 32c are further provided. The first columnar unit 31 is disposed between the first connection member 31c and the first electrode 41. The second columnar unit 32 is disposed between the second connection member 32c and the second electrode 42. A solder ball or the like is used as the first connection member 31c and the second connection member 32c, for example.

A current is supplied to the light emitting unit 10 via the first connection member 31c, the first columnar unit 31, the first electrode 41, the second connection member 32c, the second columnar unit 32, and the second electrode 42, and light (a first light) is emitted from the light emitting layer 13. The first light is blue light, for example.

The wavelength conversion layer 60 includes a light transmissive resin 61 and a plurality of particles 62. The plurality of particles 62 are dispersed in the light transmissive resin 61. The plurality of particles 62 absorb at least part of the first light emitted from the light emitting layer 13, and emit a second light having a wavelength (e.g. a peak wavelength) different from the wavelength (e.g. the peal wavelength) of the first light. A second peak wavelength of the second light is longer than a first peak wavelength of the first light, for example. The first light is blue light, and the second light includes at least one of green light, yellow light, and red light, for example. Light in which the first light and the second light are mixed is white light, for example.

A fluorescent substance is used for the plurality of particles 62, for example. At least one of a silicone-based resin (e.g. methyl phenyl silicone), an acrylic-based resin, and an epoxy-based resin is used for the light transmissive resin 61, for example.

The wavelength conversion layer 60 may further include a plurality of wavelength conversion layer fillers 65 dispersed in the light transmissive resin 61. At least one of silicon oxide, aluminum oxide, and titanium oxide may be used for the wavelength conversion layer filler 65, for example.

The intermediate layer 70 includes a first portion p1 and a second portion p2. The first portion p1 is in contact with the first semiconductor layer 11 and the wavelength conversion layer 60. The second portion p2 is in contact with the resin unit 50 and the wavelength conversion layer 60. In this example, the intermediate layer 70 further includes a third portion p3. The third portion p3 is in contact with part of the insulating layer 51 and the wavelength conversion layer 60.

The intermediate layer 70 has a thickness 70t thinner than the peak wavelength of the first light (see FIG. 1B). The peak wavelength of the first light is not less than 440 nm (nanometers) and not more than 480 nm, for example. At this time, the thickness 70t of the intermediate layer 70 is set less than 440 nm, for example. The thickness 70t of the intermediate layer 70 may be not less than 20 nm and not more than 150 nm, for example.

The intermediate layer 70 includes a material different from the material included in the wavelength conversion layer 60. In the case where a silicone-based resin, an acrylic-based resin, or an epoxy-based resin is used as the wavelength conversion layer 60, silicon oxide, silicon nitride, or the like may be used as the intermediate layer 70, for example. The intermediate layer 70 may be formed by dry film formation or wet film formation.

The intermediate layer 70 improves the adhesion between the first semiconductor layer 11 and the wavelength conversion layer 60 in the first portion p1, for example. The intermediate layer 70 improves the adhesion between the resin unit 50 and the wavelength conversion layer 60 in the second portion p2, for example. The intermediate layer 70 improves the adhesion between part of the insulating layer 51 and the wavelength conversion layer 60 in the third portion p3, for example.

An investigation by the inventors of the application has revealed that in a configuration in which the intermediate layer 70 is not provided and the wavelength conversion layer 60 is in contact with a semiconductor layer, a gap may be formed between the wavelength conversion layer 60 and the semiconductor layer and the wavelength conversion layer 60 may be peeled off from the semiconductor layer. The cause of this is presumed to be that when the turning on and off of the semiconductor device are repeated, stress will occur at the interface of the wavelength conversion layer 60 with the semiconductor layer due to a difference in thermal expansion coefficient between the wavelength conversion layer 60 and the semiconductor layer, etc.

In particular, the peeling is likely to occur when a silicone-based resin (e.g. methyl phenyl silicone) is used as the light transmissive resin 61 in the wavelength conversion layer 60 in order to obtain high dispersibility of the fluorescent substance (particles 62) while obtaining high light transmittance.

When the intermediate layer 70 is not provided, the wavelength conversion layer 60 is in contact with the resin unit 50. At this time, it has been found that peeling may occur also between the wavelength conversion layer 60 and the resin unit 50.

In the semiconductor light emitting device according to the embodiment, a thin intermediate layer 70 is interposed between the first semiconductor layer 11 and the wavelength conversion layer 60 and between the resin unit 50 and the wavelength conversion layer 60 so as to be in contact with them. The intermediate layer 70 includes a material different from the material included in the wavelength conversion layer 60. The intermediate layer 70 includes a silane coupling agent, for example. Also silicon oxide or silicon nitride may be used as the intermediate layer 70.

By using the intermediate layer 70, the peeling between the wavelength conversion layer 60 and the semiconductor layer and the peeling between the wavelength conversion layer 60 and the resin unit 50 can be suppressed. Furthermore, when the insulating layer 51 is provided, the peeling between the wavelength conversion layer 60 and the insulating layer 51 can be suppressed.

When the same material as the material used for the wavelength conversion layer 60 (e.g. a silicone resin) is used as the intermediate layer 70, it is difficult to suppress peeling sufficiently, for example. By using a material different from the material used for the wavelength conversion layer 60 (e.g. a silicone resin) as the intermediate layer 70, peeling can be suppressed sufficiently. In particular, the suppression of peeling is significant when silicon oxide or silicon nitride is used as the intermediate layer 70.

When the intermediate layer 70 is not used, the first semiconductor layer 11 (e.g. a GaN layer) and the wavelength conversion layer 60 (a silicon resin) are in direct contact, for example. The measured value of the adhesive strength between the first semiconductor layer 11 and the wavelength conversion layer 60 is 1 MPa (megapascal) to 2.5 MPa. When silicon oxide of dry film formation is used as the intermediate layer 70, the measured value of the adhesive strength is 3 MPa to 4.3 MPa. When silicon nitride of dry film formation is used as the intermediate layer 70, the measured value of the adhesive strength is 2.5 MPa to 4.0 MPa. When silicon oxide of wet film formation (e.g. an SOG) is used as the intermediate layer 70, the measured value of the adhesive strength is 2 MPa to 4.3 MPa. Thus, by using the intermediate layer 70, a high adhesive strength is obtained and consequently the peeling between the first semiconductor layer 11 and the wavelength conversion layer 60 can be suppressed.

The light transmittance of the intermediate layer 70 is preferably high. The transmittance of the intermediate layer 70 at the peak wavelength of the first light is preferably 90% or more, for example. At least one of $SiO_2$, $TiO_2$, $ZrO_2$, ZnO, $KTaO_3$, $Al_2O_3$, MgO, $Y_2O_3$, $CuSrO_2$, AlN, SiC, $CaC_2$, $BaF_2$, and $CaF_2$ may be used for the intermediate layer 70, for example.

In particular, a silane coupling agent may be used as the intermediate layer 70. The intermediate layer 70 can chemically bond to the wavelength conversion layer 60, for example.

The intermediate layer 70 includes an organic silicon compound, for example. The intermediate layer 70 includes a silicon atom and a functional group bonded to the silicon atom, for example. The functional group is a reactive functional group. The functional group includes at least one of an epoxy group, an amino group, a methacrylic group, a vinyl group, and a mercapto group, for example.

Also in this case, the peeling between the wavelength conversion layer 60 and the semiconductor layer, the peeling between the wavelength conversion layer 60 and the resin unit 50, and the peeling between the wavelength conversion layer 60 and the insulating layer 51 can be suppressed.

As shown in FIG. 1B, the intermediate layer 70 may include a filler 72. The intermediate layer 70 may include a coupling film 71 (e.g. a film of a silane coupling agent) and a plurality of fillers 72 dispersed in the coupling film 71, for example.

The coupling film 71 includes a silicon atom and a functional group bonded to the silicon atom, for example. The functional group includes at least one of an epoxy group, an amino group, a methacrylic group, a vinyl group, and a mercapto group.

By using the coupling film 71 including the filler 72 as the intermediate layer 70, the adhesive strength can be further improved. That is, the chemical bond in the coupling film 71 is produced via the filler 72. Thereby, the adhesive strength is further improved. It becomes easy to relax the stress due to a difference in thermal expansion coefficient between the semiconductor layer and the wavelength conversion layer 60.

The linear expansion coefficient of the intermediate layer 70 may be set larger than the linear expansion coefficient of the first semiconductor layer 11 and smaller than the linear expansion coefficient of the wavelength conversion layer 60, for example. The linear expansion coefficient of the first semiconductor layer 11 (e.g. GaN) is approximately $5 \times 10^{-6}$/K, for example. The linear expansion coefficient of the silicone resin used for the wavelength conversion layer 60 is $66 \times 10^{-6}$/K. The linear expansion coefficient of the intermediate layer 70 may be set to a value between these values. Thereby, it becomes more easy to suppress peeling.

The plurality of fillers 72 include at least one of $SiO_2$ and $ZrO_2$, for example. Thereby, a high light transmittance is obtained. Furthermore, the refractive index of the intermediate layer 70 can be adjusted to a desired value.

The plurality of fillers 72 may be electrically conductive. The plurality of fillers 72 may include at least one of antimony-doped tin oxide (ATO), tin-oxide-doped indium oxide (ITO), antimony pentoxide, phosphorus-doped tin oxide (PTO), and aluminum-doped zinc oxide (AZO), for example. By using these materials, a high light transmittance and electrical conductivity are obtained.

The filler 72 may have a hollow shape. At least one of the plurality of fillers 72 has a central portion 72a and an outer shell 72b around the central portion 72a, for example (see FIG. 1B). The density of the central portion 72a is lower than the density of the outer shell 72b. Each of the plurality of fillers 72 includes hollow silica. In this case, the outer shell 72b includes silica.

By the filler 72 having a hollow shape, the refractive index of the filler 72 can be controlled, and the refractive index of the intermediate layer 70 can be controlled. Furthermore, by the filler 72 having a hollow shape, the density of the filler 72 can be controlled, and the uniformity of the distribution of fillers 72 can be improved.

In the case where the coupling layer 71 (e.g. a film of a silane coupling agent) is used as the intermediate layer 70, a solution of a silane coupling agent is applied and heat treatment is performed to form the intermediate layer 70. An aqueous solution including an alcohol is used for the solution of a silane coupling agent, for example. The thickness 70t of the intermediate layer 70 is preferably thin. In view of this, the viscosity of the solution of a silane coupling agent is set low. At this time, if the density of the filler 72 is high, it is likely that fillers 72 will sink in the solution and the concentration of fillers 72 will be non-uniform.

By using the filler 72 with a hollow shape, the density of the filler 72 is reduced, and consequently it becomes easy to equalize the concentration of fillers 72 in the solution.

The diameter of each of the plurality of fillers 72 is preferably 5 nm or more. The diameter of each of the plurality of fillers 72 is not more than the thickness 70t of the intermediate layer 70.

The refractive index of the intermediate layer 70 may be set to a value between the refractive index of the semiconductor layer and the refractive index of the wavelength conversion layer. Thereby, it becomes easy to improve the light extraction efficiency. The refractive index for the first light of the first semiconductor layer 11 is higher than the refractive index for the first light of the wavelength conversion layer 60, for example. The refractive index for the first light of the first semiconductor layer 11 (e.g. GaN) is approximately 2.4. In the case where a silicon resin is used as the light transmissive resin 61 of the wavelength conversion layer 60, the refractive index for the first light of the light transmissive resin 61 is approximately 1.5.

At this time, the refractive index for the first light of the intermediate layer 70 may be set higher than 1.5 and less than 2.4. That is, the refractive index for the first light of the intermediate layer 70 may be set lower than the refractive index for the first light of the first semiconductor layer 11 and higher than the refractive index for the first light of the wavelength conversion layer 60. Thereby, reflection at the interface is suppressed, and it becomes easy to improve the light extraction efficiency.

In the embodiment, the thickness 70t of the intermediate layer 70 is set shorter than the peak wavelength of the first light, that is, relatively thin. Thereby, the possibility is reduced that light will propagate through the intermediate layer 70 along the X-Y plane and light will be emitted from the side surface of the intermediate layer 70. If light propagates through the intermediate layer 70 and light is emitted from the side surface of the intermediate layer 70, the proportion of the first light (e.g. blue light) not passing through the wavelength conversion layer 60 but emitted is large in the direction opposing the side surface. Consequently, a change in color with emission angle occurs.

In the embodiment, since the thickness 70t of the intermediate layer 70 is set thin, the emission of light from the side surface of the intermediate layer 70 can be suppressed. Thereby, the uniformity of color is improved.

When the thickness 70t of the intermediate layer 70 is much thinner than the wavelength, the reduction of light extraction efficiency is relatively small even when the refractive index of the intermediate layer 70 is not a value between the refractive index of the semiconductor layer and the refractive index of the wavelength conversion layer. That is, when the thickness 70t of the intermediate layer 70 is much thinner than the wavelength, the light that has entered the intermediate layer 70 from the semiconductor layer easily passes through the intermediate layer 70 and reaches the wavelength conversion layer 60 without large loss, regardless of the refractive index of the intermediate layer 70.

Thus, when the thickness 70t of the intermediate layer 70 is much thinner than the wavelength, the material used as the intermediate layer 70 may be optimized not from the viewpoint of the value of refractive index but from other viewpoints. For example, a relatively high light extraction efficiency is obtained also when hollow silica with a small refractive index is used as the filler 72 included in the intermediate layer 70. Thereby, an intermediate layer 70 with a uniform concentration of fillers 72 can be stably obtained.

The reflectance for the first light of the plurality of fillers 72 may be set to 50% or more, for example. As the plurality of fillers 72, for example, at least one of Pt, Ag, Si, Ti, Zr, Zn, Ta, Al, Ni, and Cu, and at least one of the compounds including at least one of Pt, Ag, Si, Ti, Zr, Zn, Ta, Al, Ni, and Cu may be used.

In the case where the resin unit 50 includes an epoxy resin and the wavelength conversion layer 60 includes the light transmissive resin 61 including a silicone resin and a plurality of particles 62 (fluorescent particles) dispersed in the light transmissive resin 61, the intermediate layer 70 preferably includes a silicon atom and an epoxy group bonded to the silicon atom, for example. That is, the intermediate layer 70 is preferably formed of a silane coupling agent including an epoxy group. At this time, the intermediate layer 70 preferably includes the filler 72 of hollow silica. Thereby, high light transmissivity and high uniformity of the density of the filler 72 as well as high adhesive strength are obtained with high productivity.

Second Embodiment

The embodiment relates to a method for manufacturing a semiconductor light emitting device.

Figure 2:
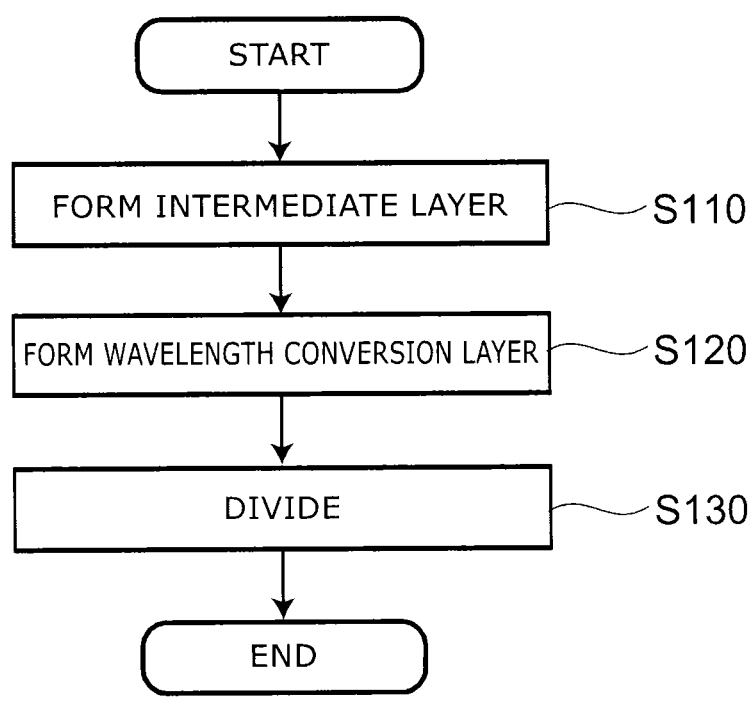
FIG. 2 is a schematic diagram illustrating a method for manufacturing a semiconductor light emitting device according to a second embodiment.

FIG. 2 is a schematic diagram illustrating a method for manufacturing a semiconductor light emitting device according to a second embodiment.

FIG. 3A to FIG. 3D are schematic cross-sectional views in order of the processes, illustrating the method for manufacturing the semiconductor light emitting device according to the second embodiment.

As shown in FIG. 2, in the manufacturing method, a resin liquid is applied onto a workpiece (step S110). The workpiece will now be described.

Figure 3A:
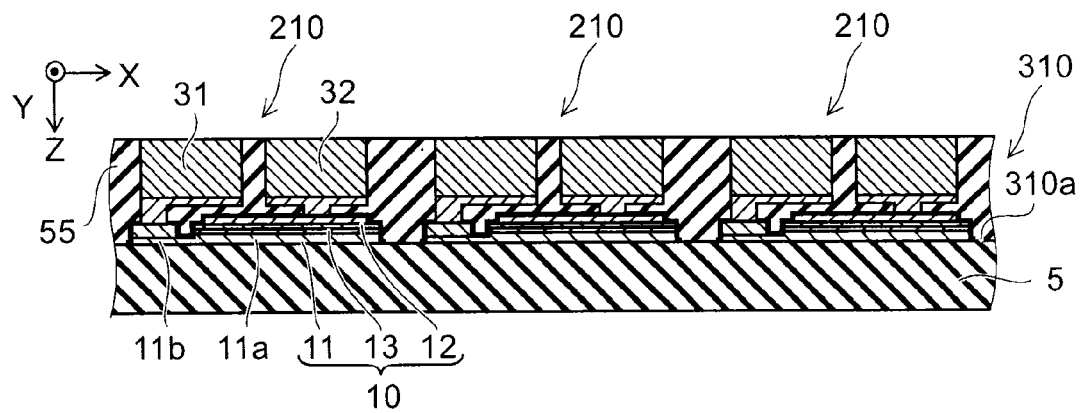
FIG. 3A to FIG. 3D are schematic cross-sectional views in order of the processes, illustrating the method for manufacturing the semiconductor light emitting device according to the second embodiment.

As shown in FIG. 3A, a semiconductor layer that forms the light emitting unit 10 is epitaxially grown on a growth substrate 5, the semiconductor layer is processed into a prescribed configuration, and the first columnar unit 31, the second columnar unit 32, and a resin layer 55 are formed, for example. Thereby, a plurality of element units 210 are formed. The growth substrate 5 is removed after the formation of the first columnar unit 31, the second columnar unit 32, and the resin layer 55. The portion from which the growth substrate 5 has been removed is taken as a workpiece 310. The workpiece 310 has a first major surface 310a. The first major surface 310a is the surface on the growth substrate 5 side.

Each of the plurality of element units 210 includes the conductive first columnar unit 31, the conductive second columnar unit 32, and the light emitting unit 10. The first columnar unit 31 extends in the first direction (e.g. the Z-axis direction). The first direction is perpendicular to the first major surface 310a. The second columnar unit 32 is apart from the first columnar unit 31 in the second direction (e.g. the X-axis direction), and extends in the first direction. The second direction is a direction parallel to the first major surface 310a, that is, a direction crossing the first direction.

The light emitting unit 10 includes the first semiconductor layer 11 of the first conductivity type, the second semiconductor layer 12 of the second conductivity type, and the light emitting layer 13. The first semiconductor layer 11 includes the first semiconductor portion 11a opposed to at least part of the first columnar unit 31 and the second semiconductor portion 11b opposed to at least part of the second columnar unit 32. The first semiconductor layer 11 is exposed at the first major surface 310a when the growth substrate 5 is removed. The second semiconductor layer 12 is provided between the second columnar unit 32 and the second semiconductor portion 11b, and the light emitting layer 13 is provided between the second semiconductor portion 11b and the second semiconductor layer 12.

The plurality of element units 210 thus configured are provided in the workpiece 310. That is, the workpiece 310 has the first major surface 310a, and includes the plurality of element units 210 aligned in a plane parallel to the first major surface 310a (the X-Y plane) and the resin layer 55 holding the plurality of element units 210. As described later, each of the plurality of element units 210 constitutes part of the semiconductor light emitting device 110. The resin layer 55 forms the resin unit 50 by being divided. An epoxy resin is used for the resin unit 50, for example.

As described above, the insulating layer 51 may be further provided between the light emitting unit 10 and the resin unit 50. Part of the insulating layer 51 may be exposed at the first major surface 310a.

Figure 3B:
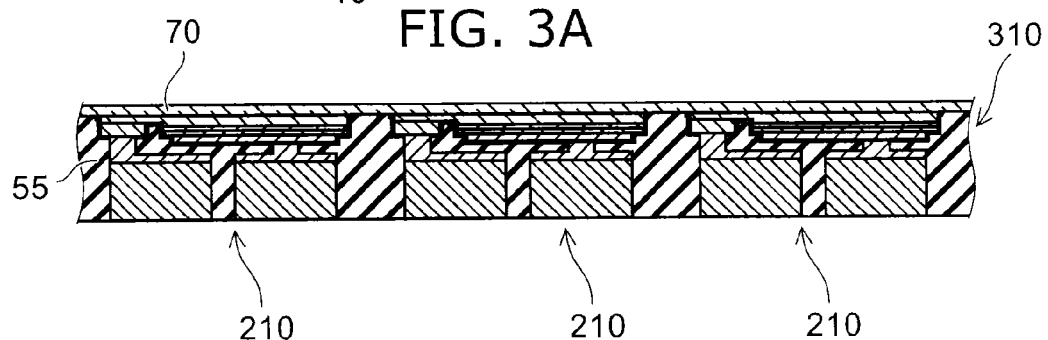

As shown in FIG. 2 and FIG. 3B, the intermediate layer 70 is formed on the first major surface 310a of the workpiece 310 thus configured. The thickness of the intermediate layer 70 is thinner than the peak wavelength of the first light.

The intermediate layer 70 may be formed by CVD or the like, for example. As the intermediate layer 70, a film including at least one of $SiO_2$, $TiO_2$, $ZrO_2$, $ZnO$, $KTaO_3$, $Al_2O_3$, $MgO$, $Y_2O_3$, $CuSrO_2$, $AlN$, $SiC$, $CaC_2$, $BaF_2$, and $CaF_2$ may be formed.

The formation of the intermediate layer 70 may include film formation by CVD using a silane coupling agent as the source gas, for example.

The formation of the intermediate layer 70 may include wet processing in which a solution including a silane coupling agent is applied, for example. A solution of a coupling agent including a silicon atom and a functional group bonded to the silicon atom may be used, for example. The functional group includes at least one of an epoxy group, an amino group, a methacrylic group, a vinyl group, and a mercapto group.

The solution that forms the intermediate layer 70 may include a plurality of fillers 72, for example. The plurality of fillers 72 include at least one of $SiO_2$ and $ZrO_2$, for example. The plurality of fillers 72 may include at least one of an antimony-doped tin oxide (ATO), tin-oxide-doped indium oxide (ITO), antimony pentoxide, phosphorus-doped tin oxide (PTO), and aluminum-doped zinc oxide (AZO). At least one of the plurality of fillers 72 may have the central portion 72a and the outer shell 72b around the central portion 72a, and the density of the central portion 72a may be lower than the density of the outer shell 72b. Hollow silica may be used as the plurality of fillers 72. The plurality of fillers 72 may include at least one of Pt, Ag, Si, Ti, Zr, Zn, Ta, Al, Ni, and Cu, and at least one of the compounds including at least one of Pt, Ag, Si, Ti, Zr, Zn, Ta, Al, Ni, and Cu.

The diameter of each of the plurality of fillers 72 is preferably 5 nm or more. It is not more than the thickness 70t of the intermediate layer 70. Thereby, a flat surface is obtained.

At least one of spin coating, slit coating, bar coating, and squeegee coating may be used for the formation of the intermediate layer 70, for example.

The film that forms the intermediate layer 70 may be formed thick, and then the thickness of the film may be reduced to form the intermediate layer 70. The film that forms the intermediate layer 70 may be formed beforehand, and the film may be attached to the first major surface 310a of the workpiece 310.

Figure 3C:
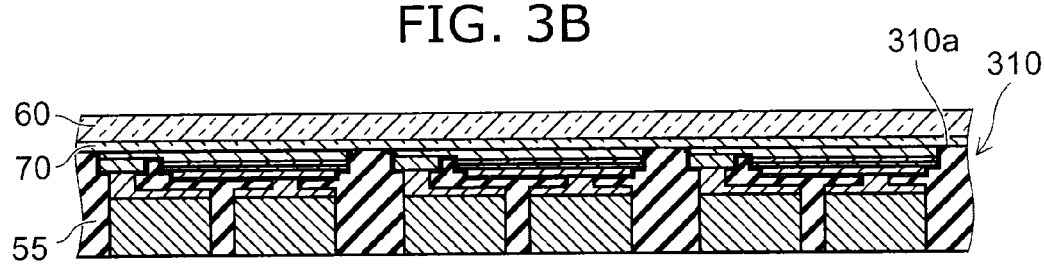

As shown in FIG. 2 and FIG. 3C, the wavelength conversion layer 60 is formed on the intermediate layer 70 (step S120). As the wavelength conversion layer 60, a layer that includes the light transmissive resin 61 and a plurality of particles 62 (e.g. fluorescent particles) dispersed in the light transmissive resin 61 and configured to absorb at least part of the first light and emit the second light of a wavelength different from the peak wavelength of the first light is formed, for example. A silicone resin may be used as the light transmissive resin 61.

The printing method may be used for the formation of the wavelength conversion layer 60, for example. A resin that forms the wavelength conversion layer may be applied by printing using a squeegee using a mask, for example. In the embodiment, the method for forming the wavelength conversion layer is arbitrary.

The intermediate layer 70 includes a material different from the material included in the wavelength conversion layer. The intermediate layer 70 can chemically bond to the wavelength conversion layer 60. Thereby, high adhesion is obtained.

Figure 3D:
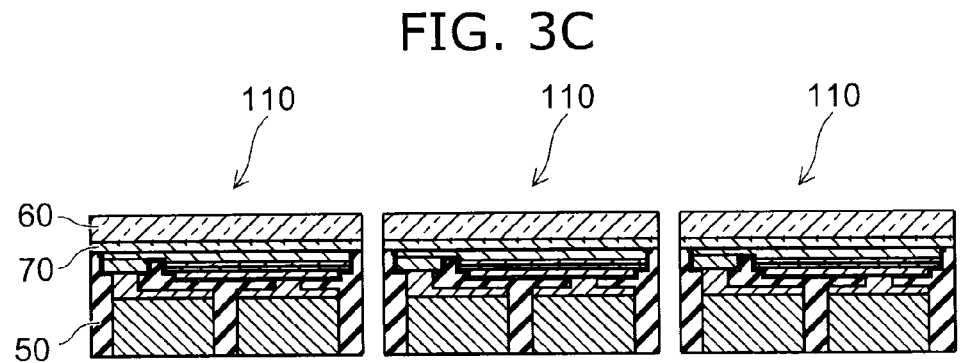

As shown in FIG. 2 and FIG. 3D, the wavelength conversion layer 60, the intermediate layer 70, and the resin unit 50 are divided for the plurality of element units 210 (step S130).

Thereby, a plurality of semiconductor light emitting devices 110 can be formed.

The embodiment can provide a method for manufacturing a semiconductor light emitting device with high reliability.

In the embodiment, the linear expansion coefficient of the intermediate layer 70 is preferably larger than the linear expansion coefficient of the first semiconductor layer 11 and smaller than the linear expansion coefficient of the wavelength conversion layer 60. Thereby, it becomes easier to suppress peeling.

In the embodiment, the refractive index for the first light of the intermediate layer 70 is preferably lower than the refractive index for the first light of the first semiconductor layer 11 and higher than the refractive index for the first light of the wavelength conversion layer 60.

Examples of the material in the embodiment will now be described.

For the first columnar unit 31 (e.g. the first metal column 31a and the first metal layer 31b) and the second columnar unit 32 (e.g. the second metal column 32a and the second metal layer 32b), for example, Cu (copper), Ni (nickel), Al (aluminum), and the like may be used.

For the particle 62, for example, at least one of a red fluorescent substance, a green fluorescent substance, a blue fluorescent substance, and a yellow fluorescent substance may be used.

As the red fluorescent substance, the following is given, for example. However, the red fluorescent substance used in the embodiment is not limited to these.

$Y_2O_2S:Eu$,
$Y_2O_2S:Eu$+a pigment,
$Y_2O_3:Eu$,
$Zn_3(PO_4)_2:Mn$,
$(Zn, Cd)S:Ag+In_2O_3$,
$(Y, Gd, Eu)BO_3$,
$(Y, Gd, Eu)_2O_3$,
$YVO_4:Eu$
$La_2O_2S:Eu, Sm$,
$LaSi_3N_5:Eu^{2+}$,
α-sialon:$Eu^{2+}$,
$CaAlSiN_3:Eu^{2+}$,
$CaSiN_x:Eu^{2+}$,
$CaSiN_x:Ce^{2+}$,
$M_2Si_5N_8:Eu^{2+}$,
$CaAlSiN_3:Eu^{2+}$,
$(SrCa)AlSiN_3:Eu^{x+}$, and
$Sr_x(Si_yAl_3)_z(O_xN):Eu^{x+}$.

As the green fluorescent substance, the following is given, for example. However, the green fluorescent substance used in the embodiment is not limited to these.

ZnS:Cu, Al,
ZnS:Cu, Al+a pigment,
(Zn, Cd)S:Cu, Al,
ZnS:Cu, Au, Al+a pigment,
$Y_3Al_5O_{12}:Tb$,
$Y_3(Al, Ga)_5O_{12}:Tb$,
$Y_2SiO_5:Tb$,
$Zn_2SiO_4:Mn$,
(Zn, Cd)S:Cu,
ZnS:Cu,
$Zn_2SiO_4:Mn$,
$ZnS:Cu+Zn_2SiO_4:Mn$,
$Gd_2O_2S:Tb$,
(Zn, Cd)S:Ag,
ZnS:Cu, Al,
$Y_2O_2S:Tb$,
$ZnS:Cu, Al+In_2O_3$,
$(Zn, Cd)S:Ag+In_2O_3$,
$(Zn, Mn)_2SiO_4$,
$BaAl_{12}O_{19}:Mn$,
$(Ba, Sr, Mg)O.aAl_2O_3:Mn$,
$LaPO_4:Ce, Tb$,
$Zn_2SiO_4:Mn$,
ZnS:Cu,
$3(Ba, Mg, Eu, Mn)O.8Al_2O_3$,
$La_2O_3.0.2SiO_2.0.9P_2O_5:Ce, Tb$,
$CeMgAl_{11}O_{19}:Tb$,
$CaSc_2O_4:Ce$,
$(BrSr)SiO_4:Eu$,
α-sialon:$Yb^{2+}$,
β-sialon:$Eu^{2+}$,
$(SrBa)YSi_4N_7:Eu^{2+}$,
$(CaSr)Si_2O_4N_7:Eu^{2+}$, and
Sr(SiAl)(ON):Ce.

As the blue fluorescent substance, the following is given, for example. However, the blue fluorescent substance used in the embodiment is not limited to these.

ZnS:Ag,
ZnS:Ag+a pigment,
ZnS:Ag, Al,
ZnS:Ag, Cu, Ga, Cl,
$ZnS:Ag+In_2O_3$,
$ZnS:Zn+In_2O_3$,
$(Ba, Eu)MgAl_{10}O_{17}$,
$(Sr, Ca, Ba, Mg)_{10}(PO_4)_6Cl_2:Eu$,
$Sr_{10}(PO_4)_6Cl_2:Eu$,
$(Ba, Sr, Eu)(Mg, Mn)Al_{10}O_{17}$,
$10(Sr, Ca, Ba, Eu).6PO_4.Cl_2$, and
$BaMg_2Al_{16}O_{25}:Eu$.

As the yellow fluorescent substance, the following is given, for example. However, the yellow fluorescent substance used in the embodiment is not limited to these.

$Li(Eu, Sm)W_2O_8$,
$(Y, Gd)_3, (Al, Ga)_5O_{12}:Ce^{3+}$,
$Li_2SrSiO_4:Eu^{2+}$,
$(Sr(Ca, Ba))_3SiO_5:Eu^{2+}$, and
$SrSi_2ON_{2.7}:EU^{2+}$.

The embodiment can provide a semiconductor light emitting device with high reliability.

In the specification, "nitride semiconductor" includes all semiconductors expressed by the chemical formula of $B_xIn_yAl_zGa_{1-x-y-z}N$ (0≤x≤1, 0≤y≤1, 0≤z≤1, x+y+z≤1) in which the composition ratios x, y, and z are changed in the respective ranges. Furthermore, also those further including a group V element other than N (nitrogen) and those further including one of various dopants added in order to control the conductivity type etc. in the chemical formula mentioned above are included in the "nitride semiconductor."

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of semiconductor light emitting devices such as columnar units, wavelength conversion layers, light emitting units, semiconductor layers, light emitting layers, resin units, wavelength conversion layers, light transmissive resins, particles, intermediate layers, fillers, insulating layers, and electrodes from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

What is claimed is:
1. A semiconductor light emitting device comprising:
   a conductive first columnar unit extending in a first direction;
   a conductive second columnar unit provided apart from the first columnar unit in a second direction crossing the first direction and extending in the first direction;

a wavelength conversion layer provided apart from the first columnar unit and the second columnar unit in the first direction;
a light emitting unit including:
  a first semiconductor layer of a first conductivity type including:
    a first semiconductor portion provided between at least part of the first columnar unit and the wavelength conversion layer; and
    a second semiconductor portion provided between the second columnar unit and the wavelength conversion layer;
  a second semiconductor layer of a second conductivity type provided between the second columnar unit and the second semiconductor portion; and
  a light emitting layer provided between the second semiconductor portion and the second semiconductor layer and configured to emit a first light;
a resin unit covering a side surface along the first direction of the first columnar unit, a side surface along the first direction of the second columnar unit, a side surface of the light emitting unit, and a surface on a side of the first columnar unit and the second columnar unit of the light emitting device; and
an intermediate layer including:
  a first portion in contact with the first semiconductor layer and the wavelength conversion layer; and
  a second portion in contact with the resin unit and the wavelength conversion layer,
having a thickness thinner than a peak wavelength of the first light, and including a material different from a material included in the wavelength conversion layer,
wherein a linear expansion coefficient of the intermediate layer is larger than a linear expansion coefficient of the first semiconductor layer and smaller than a linear expansion coefficient of the wavelength conversion layer.

2. The device according to claim 1, wherein a thickness of the intermediate layer is less than 440 nanometers.

3. The device according to claim 1, wherein
the intermediate layer includes a plurality of fillers,
at least one of the fillers has a central portion and an outer shell around the central portion, and
a density of the central portion is lower than a density of the outer shell.

4. The device according to claim 3, wherein a diameter of each of the fillers is not more than a thickness of the intermediate layer.

5. The device according to claim 1, further comprising an insulating layer provided between the light emitting unit and the resin unit,
the intermediate layer further including a third portion in contact with part of the insulating layer and the wavelength conversion layer.

6. The device according to claim 1, wherein a thickness of the wavelength conversion layer is not less than 80 micrometers and not more than 250 micrometers.

7. The device according to claim 1, wherein
the wavelength conversion layer includes at least one of a silicone-based resin, an acrylic-based resin, and an epoxy-based resin and
the intermediate layer includes at least one of silicon oxide and silicon nitride.

8. The device according to claim 1, wherein a thickness of the intermediate layer is not less than 20 micrometers and not more than 150 micrometers.

9. The device according to claim 1, wherein the intermediate layer includes at least one of $SiO_2$, $TiO_2$, $ZrO_2$, $ZnO$, $KTaO_3$, $Al_2O_3$, $MgO$, $Y_2O_3$, $CuSrO_2$, $AlN$, $SiC$, $CaC_2$, $BaF_2$, and $CaF_2$.

10. The device according to claim 1, wherein the intermediate layer includes a silane coupling agent.

11. The device according to claim 1, wherein
the intermediate layer includes a silicon atom and a functional group bonded to the silicon atom and
the functional group includes at least one of an epoxy group, an amino group, a methacrylic group, a vinyl group, and a mercapto group.

12. The device according to claim 1, wherein
the intermediate layer includes a coupling film and a plurality of fillers dispersed in the coupling film, and
the coupling film includes a silicon atom and a functional group bonded to the silicon atom and the functional group includes at least one of an epoxy group, an amino group, a methacrylic group, a vinyl group, and a mercapto group.

13. The device according to claim 1, wherein
the intermediate layer includes a plurality of fillers and
the fillers include at least one of SiO2 and ZrO2.

14. The device according to claim 1, wherein
the intermediate layer includes a plurality of fillers and
the fillers include at least one of antimony-doped tin oxide, tin-oxide-doped indium oxide, antimony pentoxide, phosphorus-doped tin oxide, and aluminum-doped zinc oxide.

15. The device according to claim 1, wherein
the intermediate layer includes a plurality of fillers and
a diameter of each of the fillers is 5 nanometers or more.

16. The device according to claim 1, wherein
the intermediate layer includes a plurality of fillers and
the fillers include at least one metal of Pt, Ag, Si, Ti, Zr, Zn, Ta, Al, Ni, and Cu and at least one of the compounds including at least one of Pt, Ag, Si, Ti, Zr, Zn, Ta, Al, Ni, and Cu.

17. The device according to claim 1, wherein
the resin unit includes an epoxy resin,
the wavelength conversion layer includes a light transmissive resin including a silicone resin and a plurality of particles 62 dispersed in the light transmissive resin, and
the intermediate layer includes a silicon atom and an epoxy group bonded to the silicon atom.

18. The device according to claim 1, wherein
the intermediate layer includes a filler of hollow silica.

19. The device according to claim 18, wherein a refractive index of the intermediate layer is between a refractive index of the first semiconductor layer and a refractive index of the wavelength conversion layer.

* * * * *